US006903570B2

(12) United States Patent
Kawase et al.

(10) Patent No.: US 6,903,570 B2
(45) Date of Patent: Jun. 7, 2005

(54) BIDIRECTIONAL SIGNAL TRANSMISSION CIRCUIT

(75) Inventors: Kimitaka Kawase, Kanagawa (JP); Teturou Yamamoto, Kanagawa (JP); Katsuhide Uchino, Kanagawa (JP)

(73) Assignee: Sony Corporation (JP)

( * ) Notice: Subject to any disclaimer, the term of this patent is extended or adjusted under 35 U.S.C. 154(b) by 67 days.

(21) Appl. No.: 10/678,076

(22) Filed: Oct. 6, 2003

(65) Prior Publication Data

US 2004/0100304 A1 May 27, 2004

(30) Foreign Application Priority Data

Nov. 22, 2002 (JP) ....................................... 2002-339951

(51) Int. Cl.$^{7}$ ............................................... H03K 19/173

(52) U.S. Cl. .............................. 326/38; 326/46; 326/82

(58) Field of Search ............................... 326/37–41, 46, 326/82, 83, 89, 93

(56) References Cited

U.S. PATENT DOCUMENTS

| | | | | |
|---|---|---|---|---|
| 4,713,557 A | * 12/1987 | Carter | ......................... | 326/86 |
| 5,656,950 A | * 8/1997 | Duong et al. | ................. | 326/41 |
| 6,313,663 B1 | * 11/2001 | Mueller et al. | ............... | 326/83 |

FOREIGN PATENT DOCUMENTS

| | | |
|---|---|---|
| JP | 07-013513 | 1/1995 |
| JP | 07-146462 | 6/1995 |
| JP | 08-055493 | 2/1996 |
| JP | 08-079663 | 3/1996 |
| JP | 08-106795 | 4/1996 |
| JP | 11-176186 | 2/1999 |
| JP | 11-305742 | 11/1999 |

* cited by examiner

*Primary Examiner*—Don Le
(74) *Attorney, Agent, or Firm*—Rader, Fishman & Grauer, PLLC; Ronald P. Kananen

(57) ABSTRACT

A bidirectional signal transmission circuit includes: a buffer element for reducing the impedance of a signal line; a signal line disposed between input terminals in both ends of the bidirectional signal transmission circuit; and a signal line disposed between output terminals in these ends. The signal lines are parallel to each other. A signal supplied from the exterior of the bidirectional signal transmission circuit is sequentially transmitted from one end to the other end of this circuit and is then output as an output signal from the other end in order to confirm the sequential transmission at the exterior. The transmitting direction is changeable between these ends in response to a switching signal supplied from the exterior. The buffer element for reducing the impedance of the signal line is disposed in at least one end of the signal line arranged between the output terminals.

4 Claims, 14 Drawing Sheets

BIDIRECTIONAL SIGNAL TRANSMISSION CIRCUIT

BACKGROUND OF THE INVENTION

1. Field of the Invention

The present invention relates to a bidirectional signal transmission circuit which can be applied to a drive circuit for an active matrix display having an image reversing function. More particularly, the present invention relates to a technology for reducing noise generated in a bidirectional signal transmission circuit.

2. Description of the Related Art

Active matrix displays each having a scan drive circuit using polycrystalline silicon thin film transistors are typified by liquid crystal displays and organic electroluminescent displays. For the liquid crystal display used in, for example, a camcorder or an information portable terminal, in order to support an application for displaying an image on a rotatable monitor, the display uses a scan drive circuit having a lateral reversing function and a longitudinal reversing function. In other words, the display has a bidirectional scan drive circuit therein. The size of the display is recently being increased. Following the increase of the size thereof, an approach of connecting display panels to constitute a large screen is known. For example, in a case where four display panels constitute one large screen and the display panels having the same structure are arranged in each diagonal line, one of the display panels is rotated by 180 degrees and is disposed. In order to uniform the scanning direction of an image to be displayed, each display panel needs to have a bidirectional scan drive circuit therein. A bidirectional signal transmission circuit constitutes the principal part of the bidirectional scan drive circuit. For example, Japanese Unexamined Patent Application Publication Nos. 7-13513, 7-146462, 8-55493, 8-79663, 8-106795, 11-176186, and 11-305742 disclose known arts.

In a known bidirectional signal transmission circuit, a signal supplied from the exterior of this circuit is sequentially transmitted from one end to the other end of the circuit. In order to confirm the sequential transmission at the exterior of the circuit, the transmitted signal is output. The signal transmitting direction is changeable between both the ends of the circuit in response to a switching signal which is supplied from the exterior. The known bidirectional signal transmission circuit utilizes a layout design to reduce the number of terminals connected to the outside as much as possible. Specifically, in the layout design, a signal line disposed between input terminals in both the ends of the bidirectional signal transmission circuit is parallel to a signal line arranged between output terminals in these ends. In order to reduce the number of terminals as mentioned above, each line connecting the terminals in these ends of the bidirectional signal transmission circuit is long and has high resistance. Therefore, a steep change in potential of a signal line causes noise on the adjacent signal line. The noise triggers a malfunction in the bidirectional signal transmission circuit.

SUMMARY OF THE INVENTION

The present invention is made in order to overcome the above-mentioned disadvantages. It is an object of the present invention to provide a bidirectional signal transmission circuit including, a buffer element for reducing the impedance of a signal line, a signal line disposed between input terminals in both ends of the bidirectional signal transmission circuit, and a signal line disposed between output terminals in these ends, the signal lines being parallel to each other, a signal supplied from the exterior of the bidirectional signal transmission circuit being sequentially transmitted from one end to the other end of the bidirectional signal transmission circuit and then being output from the other end in order to confirm the sequential transmission at the exterior, the transmitting direction being changeable between these ends in response to a switching signal supplied from the exterior, wherein the buffer element for reducing the impedance of the signal line is disposed in at least one end of the signal line arranged between the output terminals.

Preferably, the bidirectional signal transmission circuit further includes: a gate element connected to the output terminals in both the ends of the bidirectional signal transmission circuit, the gate element passing a signal generated from the output terminal on one end selected in accordance with the transmitting direction; and a potential fixing unit for fixing the potential of the output terminal in the other end which is not selected in accordance with the transmitting direction so that the potential thereof is not floating. For example, the potential fixing unit includes either a pull-up element for pulling up the potential of an output of the buffer element, disposed close to the output terminal which is not selected, to the potential of a power supply in response to the switching signal, or a pull-down element for pulling down the output potential of the buffer element to a ground potential in response to the switching signal. In some cases, signal line segments extending from the respective output terminals in both the ends of bidirectional signal transmission circuit are connected into one signal line. The bidirectional signal transmission circuit further includes a high-impedance state producing unit for setting an output of the buffer element to high impedance in response to the switching signal when the output terminal close to the buffer element is not selected in accordance with the switching signal.

According to the present invention, in the bidirectional signal transmission circuit, the buffer element is arranged in order to set an operation confirmation signal at low impedance, the signal being output from an output terminal in one end of the bidirectional signal transmission circuit. Further, when the output terminal close to the buffer element is not selected, the potential of an output of the buffer element is fixed to a high level or a low level using a pull-up or pull-down element. Consequently, the influence of noise caused at the rising edge or falling edge of a signal on the adjacent signal line can be reduced, thus preventing malfunctions of shift registers. In addition, a sharp noise generated in a scan line of a display unit is eliminated by reducing the influence of the above noise. Thus, a lateral linear defect in a display can be removed.

DESCRIPTION OF THE PREFERRED EMBODIMENTS

Figure 1:
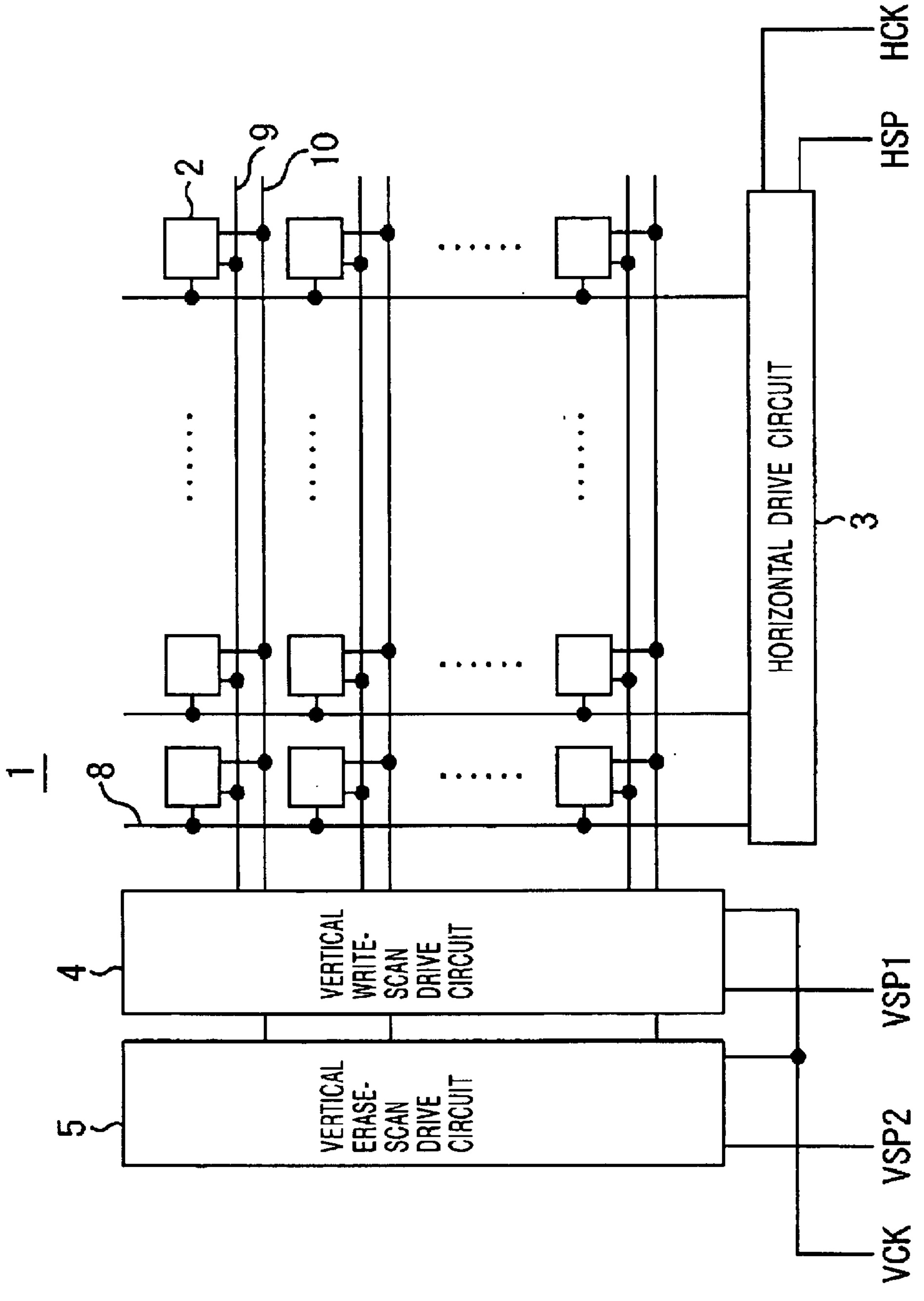
FIG. 1 is a block diagram of a known active matrix organic electroluminescent (EL) display.

Embodiments of a bidirectional signal transmission circuit according to the present invention will be described in detail with reference to the drawings. Prior to the description, to clarify the background of the present invention, the general structure of a known active matrix display having a bidirectional signal transmission circuit therein will now be described with reference to FIG. 1. An active matrix display 1 comprises: pixels 2 arranged in a matrix; a horizontal drive circuit 3 for supplying a necessary drive current to the pixels 2 through data lines 8; a vertical write-scan drive circuit 4 for scanning write timing in the vertical direction; and a vertical erase-scan drive circuit 5 for scanning erase timing. The pixels 2, arranged in a matrix, constitute a display unit, and the drive circuits 3, 4, and 5 constitute a drive unit. The display 1 has a panel structure. In the structure, the display unit and the drive unit are integrated on the same substrate. The horizontal drive circuit 3 receives a start pulse HSP and a clock pulse HCK in the horizontal direction. The vertical write-scan drive circuit 4 receives a start pulse VSP1 and a clock pulse VCK for write scan in the vertical direction. The vertical erase-scan drive circuit 5 receives a start pulse VSP2 and the clock pulse VCK for erase scan in the vertical direction.

Referring to FIG. 1, write scan lines 9 are laterally arranged and the data lines 8 are longitudinally arranged. Each pixel 2 is disposed at the intersection of the write scan line 9 and the data line 8. An erase scan line 10 is formed in parallel to each write scan line 9. The write scan lines 9 are connected to the vertical write-scan drive circuit 4. The vertical write-scan drive circuit 4 includes a signal transmission circuit comprising shift registers. Synchronously with the vertical clock pulse VCK, the vertical write-scan drive circuit 4 sequentially transfers the vertical start pulse VSP1 to select the write scan line 9 for one scan cycle.

The erase scan lines 10 are connected to the vertical erase-scan drive circuit 5. The vertical erase-scan drive circuit 5 also includes a signal transmission circuit comprising shift registers. Synchronously with the vertical clock pulse VCK, the vertical erase-scan drive circuit 5 sequentially transfers the vertical start pulse VSP2, thus generating a control signal to the erase scan line 10. The data lines 8 are connected to the horizontal drive circuit 3. Synchronously with line-sequential scanning of the write scan lines 9, the respective data lines 8 generate electric signals corresponding to brightness information. For instance, the horizontal drive circuit 3 performs line-sequential driving and supplies the electric signals to a line comprising the selected pixels 2. Consequently, the brightness information is written to the line comprising the pixels 2. The respective pixels 2 start light emission at the intensity corresponding to the written brightness information. The vertical erase-scan drive circuit 5 receives the start pulse VSP2 and then sequentially selects the erase scan line 10 synchronously with the vertical clock pulse VCK. Thus, the light emission of the pixels 2 corresponding to the scan line is stopped.

Figure 2:
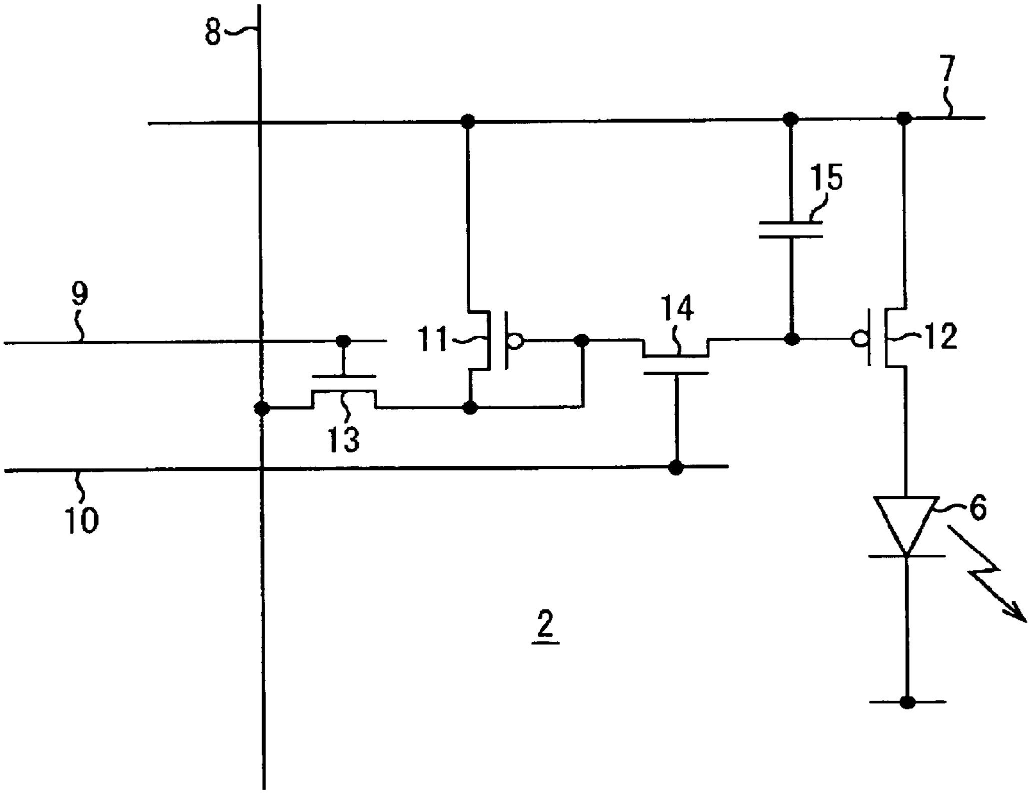
FIG. 2 illustrates a pixel circuit constituting the known active matrix organic EL display.

FIG. 2 is a circuit diagram of the specific structure of each pixel 2. The pixel 2 comprises: an organic electroluminescent (EL) element 6; a current supply line 7; the data line 8; the write scan line 9; the erase scan line 10; a write transistor 11; a drive transistor 12; a write scan transistor 13; an erase scan transistor 14; and a hold capacitor 15. The gate of the write scan transistor 13 is connected to the write scan line 9 in which timing is formed by the vertical write-scan drive circuit 4 shown in FIG. 1. The gate of the erase scan transistor 14 is connected to the erase scan line 10 in which timing is formed by the vertical erase-scan drive circuit 5 shown in FIG. 1.

As mentioned above, this known display comprises: the vertical write-scan drive circuit 4 for sequentially selecting the write scan line 9; the vertical erase-scan drive circuit 5 for sequentially selecting the erase scan line 10; the horizontal drive circuit 3 for generating a signal current held at a current level corresponding to brightness information and supplying the current to the data line 8; and the pixels 2, each of which is arranged at the intersection of the scan lines 9 and 10 and the data line 8, and includes the current-drive type EL element 6 which receives a drive current to emit light.

Referring to FIG. 2, each pixel 2 comprises: an input section for receiving a signal current supplied from the data line 8 when the corresponding write scan line 9 is selected; a conversion section for temporarily converting a current level of the obtained signal current into a voltage level and holding the voltage level; and a drive section for supplying a drive current held at a current level corresponding to the held voltage level to the EL element 6. Specifically, the input section comprises the write scan transistor 13. The conversion section comprises: the write transistor 11 having a gate, a source, a drain, and a channel; and the hold capacitor 15 connected to the gate of the write transistor 11. The write transistor 11 supplies the signal current obtained by the input section to the channel, thus generating the converted voltage level at the gate. The hold capacitor 15 holds the voltage level generated at the gate. The conversion section further includes the erase scan transistor 14 disposed between the gate of the write transistor 11 and the hold capacitor 15. When the current level of the signal current is converted into the voltage level, the erase scan transistor 14 is turned on to generate the voltage level at the gate of the transistor 11, the voltage level being based on the voltage level at the source. When the hold capacitor 15 holds the voltage level, the erase scan transistor 14 is turned off to disconnect the gate of the write transistor 11 from the hold capacitor 15. In addition, upon erase scanning, the erase scan transistor 14 is turned on to erase the voltage level held by the hold capacitor 15, thus turning off the EL element 6. Further, the drive section includes the drive transistor 12 having a gate, a drain, a source, and a channel. The drive transistor 12 receives the voltage level held by the hold capacitor 15 at the gate and then supplies a drive current having a current level corresponding to the voltage level to the EL element 6 through the channel. The gate of the write transistor 11 is connected to the gate of the drive transistor 12 through the erase scan transistor 14 for switching, thus constituting a current mirror circuit. Accordingly, the current level of the signal current is proportional to that of the drive current. The drive transistor 12 operates in the saturation region. The drive transistor 12 supplies a drive current corresponding to the difference between the voltage applied to the gate thereof and a threshold voltage to the EL element 6.

Figure 3:
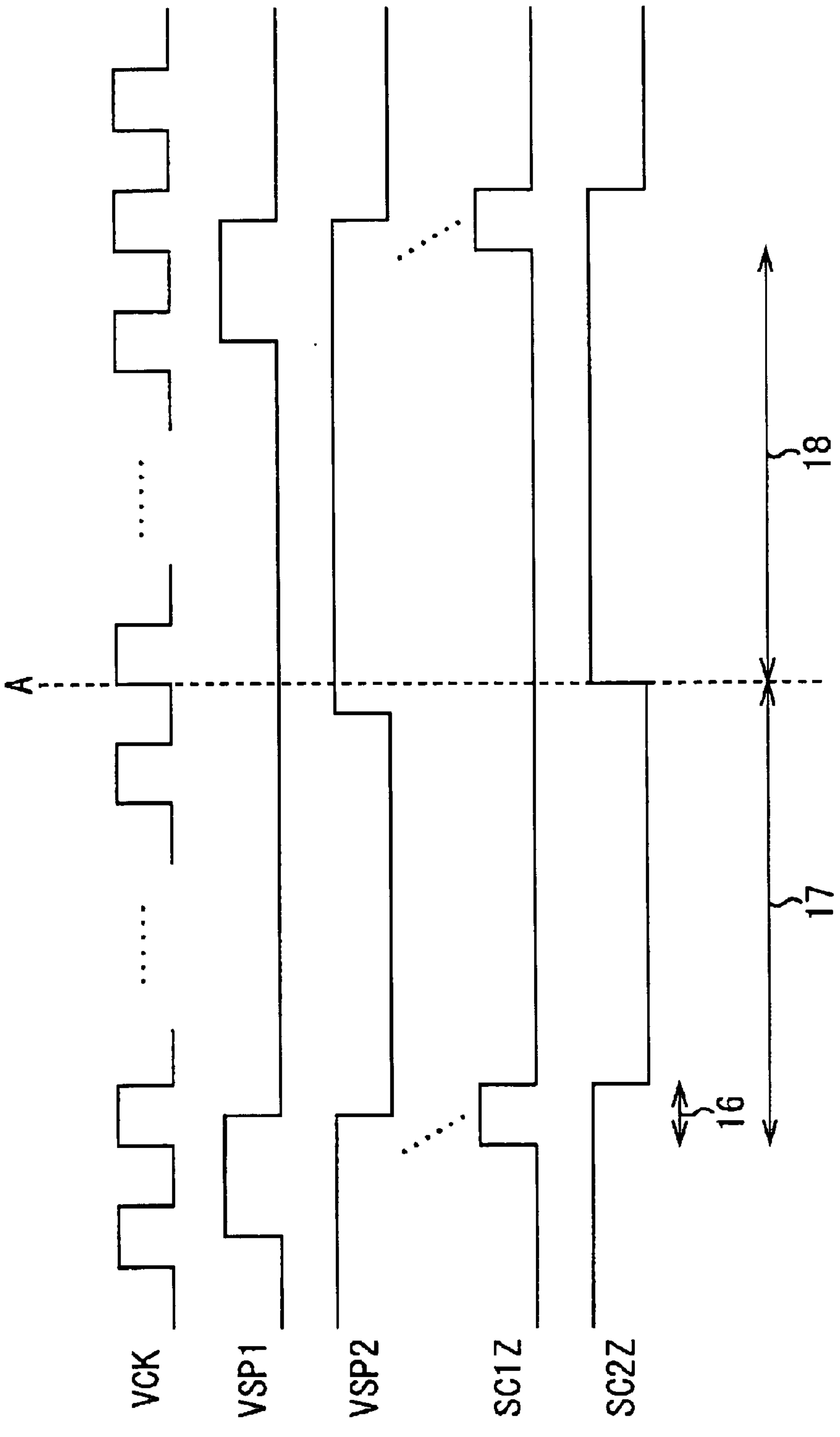
FIG. 3 is a timing chart explaining the operation of the known active matrix organic EL display.

FIG. 3 is a timing chart explaining the operation of the display shown in FIGS. 1 and 2. The start pulses VSP1 and VSP2 supplied to the vertical scan drive circuits 4 and 5 are sequentially shifted on the basis of the clock pulses VCK. A write scan line SC1Z and an erase scan line SC2Z are connected to a certain pixel. When the write scan line SC1Z and the erase scan line SC2Z simultaneously become a level "H" (high), the write scan transistor and the erase scan transistor in the pixel circuit are simultaneously turned on. The period during which both the scan lines SC1Z and SC2Z are at the level "H" will now be called a write period 16. An EL drive current is determined on the basis of the current mirror ratio of the write transistor 11 and the drive transistor 12. For the write period 16, the EL drive current is controlled by a write current. The EL drive current is determined by the difference between the potential at the gate and that at the source of the drive transistor 12. For the write period 16, when the write current settles down at a certain level, the EL element 6 starts light emission at desired brightness. When writing is completed, the scan lines SC1Z and SC2Z simultaneously go to a level "L" (low), so that the write scan transistor 13 and the erase scan transistor 14 are turned off. Consequently, the gate-source voltage of the drive transistor 12 is held by the hold capacitor 15 and the light emission of the EL element 6 is kept at desired brightness. Referring to FIG. 3, the erase scan line SC2Z again goes to the level "H" at timing A, thus turning the erase scan transistor 15 on. Consequently, the voltage held by the hold capacitor 15 increases to a value that is approximate to the potential of the current supply line through the erase scan transistor 14 and the write transistor 11, so that the gate-source voltage of the drive transistor 12 is equal to or less than a threshold voltage Vth. Thus, the light emission of the EL element 6 is stopped. The light emitting period of the EL element 6 corresponds to a period 17 in FIG. 3. Duty driving of the EL element can be performed by adjusting timing A. Thus, RGB balancing can be performed with higher reliability and the flexibility of designing the electrical characteristics of the EL element can be increased.

In a CRT, the brightness of a displayed image attenuates at a rate on the order of microseconds. On the other hand, according to the display principle of the active matrix display, an image is continuously displayed for one frame. Accordingly, in displaying moving images, pixels corresponding to the outline of a moving image display the image just before frame change. Combined with the persistence of human vision, human eyes sense the image as if the image is displayed in the next frame. Disadvantageously, this is the root cause of the lower image quality of moving images in the active matrix display than that of the CRT. The above-mentioned duty driving is effective in overcoming the above disadvantages. Introducing a technique of forcing pixels into turning-off to erase a residual image sensed by the human eyes results in the improvement of the quality of moving images. Specifically, the active matrix display can utilize a method for displaying an image in the first half of one frame and then turning pixels off in the second half of the frame just like the attenuation of the CRT brightness. To improve the quality of moving images, the duty cycle of turn-on/off per frame is set to about 50%. To achieve the improvement of the higher quality thereof, the duty cycle of turn-on/off per frame is set to 25% or less.

Figure 4:
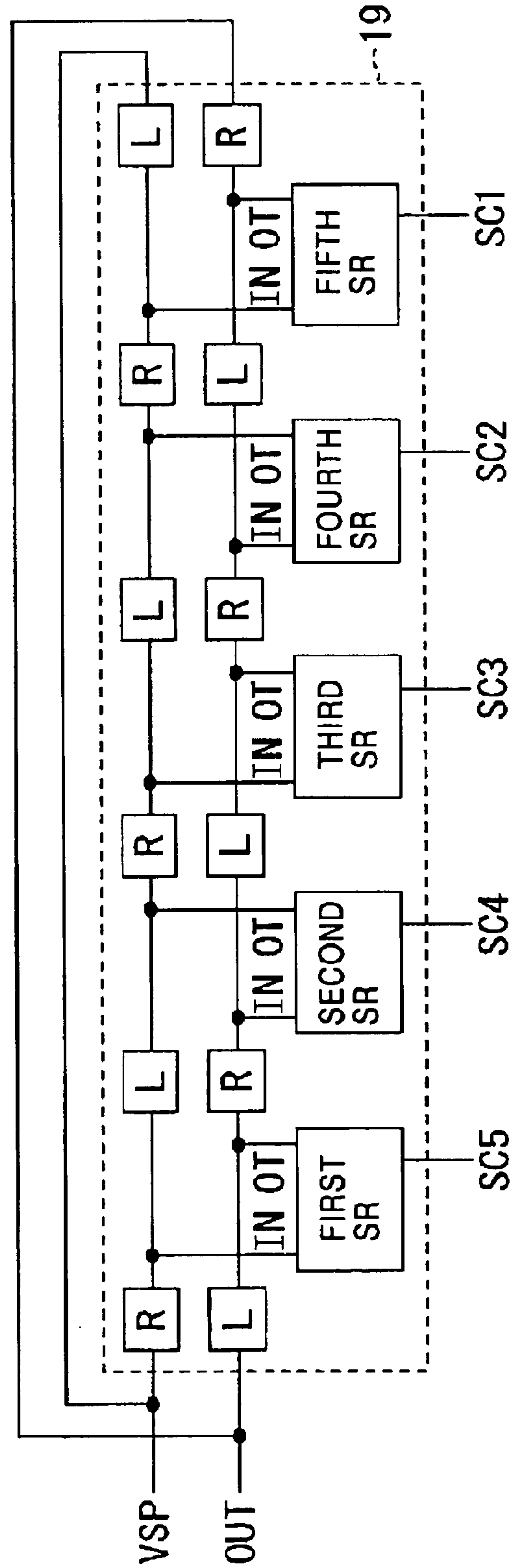
FIG. 4 is a block diagram of a known bidirectional signal transmission circuit.

To achieve image reversing, the active matrix display described with reference to FIGS. 1 to 3 needs a bidirectional signal transmission circuit. FIG. 4 shows the general structure of a known bidirectional signal transmission circuit 19. For example, in lateral reversing, the bidirectional signal transmission circuit is applied to the horizontal drive circuit 3 shown in FIG. 1. In longitudinal reversing, the bidirectional signal transmission circuit is applied to each of the vertical write-scan drive circuit 4 and the vertical erase-scan drive circuit 5 shown in FIG. 1.

Referring to FIG. 4, the bidirectional signal transmission circuit 19 comprises shift registers (SRs), forward-path gate elements L, and backward-path gate elements R. For example, a vertical start pulse VSP is supplied to an input terminal in either end of the bidirectional signal transmission circuit 19. A detection signal OUT to confirm the operation of the circuit is generated from an output terminal in the other end. Generally, the number of input and output terminals of a display panel is reduced as much as possible. Accordingly, a signal line for the start pulse VSP and a signal line for the detection signal OUT are connected to one end of the bidirectional signal transmission circuit 19.

The bidirectional signal transmission circuit 19 includes the shift registers each having an input terminal IN and an output terminal OT. The input and output terminals are connected to realize a multi-stage structure. In this case, to easily understand the structure, first to fifth shift registers SC5 to SC1 are connected, namely, five stages are formed. In practical applications, the number of stages is not limited. Each backward-path gate element R is disposed in a connection path between the output terminal of the shift register in the fore stage and the input terminal of the shift register in the subsequent (back) stage, the shift registers being adjacent to each other. Each forward-path gate element L is disposed in another connection path between the output terminal of the back shift register and the input terminal of the fore shift register. For example, in the multi-stage connection in FIG. 4, the first SR SC5 denotes the fore shift register and the second SR SC4 denotes the back shift register. The backward-path gate element R is disposed in the connection path between the output terminal OT of the first SR SC5 and the input terminal IN of the second SR SC4. The forward-path gate element L is arranged in another connection path between the output terminal OT of the second SR SC4 and the input terminal IN of the first SR SC5. The backward-path gate elements R and the forward-path gate elements L are alternatively selected, thus opening and closing the respective elements. In this manner, the transfer of a backward signal from the fore stage to the back stage (signal transfer from the left to the right in FIG. 4) can be switched to/from the transfer of a forward signal from the back stage to the fore stage (signal transfer from the right to the left in FIG. 4).

Figure 5:
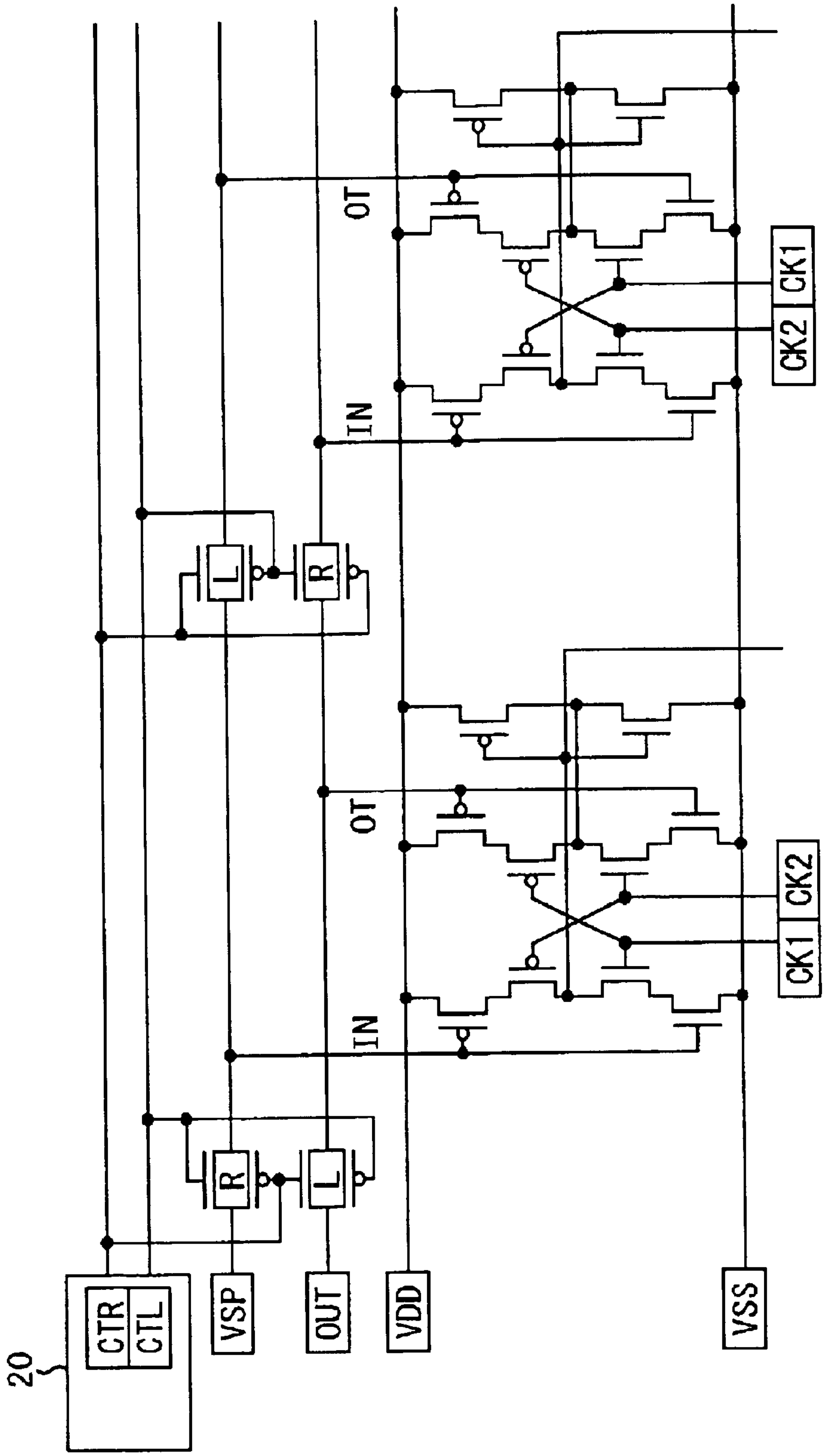
FIG. 5 is a circuit diagram of the known bidirectional signal transmission circuit of FIG. 4.

FIG. 5 is a circuit diagram of the structure of the bidirectional signal transmission circuit 19 shown in FIG. 4 by way of example. To simplify the diagram, the first SR, the second SR, and the backward-path gate elements R and the forward-path gate elements L provided for the respective SRs are shown. Each SR comprises a D type flip-flop and functions as a clock control type signal transmission block. The D type flip-flop comprises first and second clocked inverters and a third inverter. The D type flip-flop operates in response to clock signal CK1 or CK2, the clock signals being 180° out of phase with each other. The D type flip-flop delays a signal supplied to the input terminal IN by a half period of the clock signal and then generates the delayed signal from the output terminal OT. The backward-path gate element R comprises a CMOS type transmission gate element. The forward-path gate element L also comprises a transmission gate element. The backward-path gate element R and the forward-path gate element L are controlled by control signals CTR and CTL supplied from a direction control circuit 20. The signals CTR and CTL are 180° out of phase with each other. When the control signal CTR is at the level "H" and the other control signal CTL is at the level "L", the backward-path gate elements R are opened and the forward-path gate elements L are closed. Accordingly, the start pulse VSP passes through the first backward-path gate element R and is then supplied to the input terminal IN of the first SR. In the first SR, the signal VSP is delayed by the half period of the clock signal and is then transferred from the output terminal OT of the first SR to the input terminal IN of the second SR through the subsequent backward-path gate element R. In this manner, the start pulse VSP is sequentially transferred in the backward direction. On the other hand, when the control signal CTR goes to the level "L" and the control signal CTL goes to the level "H", the backward-path gate elements R are closed and the forward-path gate elements L are opened. In this instance, a signal transferred in the forward direction is supplied to the input terminal IN of the second SR and is then subjected to a predetermined delay process. The delayed signal is transferred from the output terminal OT of the second SR to the input terminal IN of the first SR through the forward-path gate element L. The transferred signal is subjected to the predetermined delay process and is then generated from the output terminal OT of the first SR to the subsequent forward-path gate element L.

Figure 6:
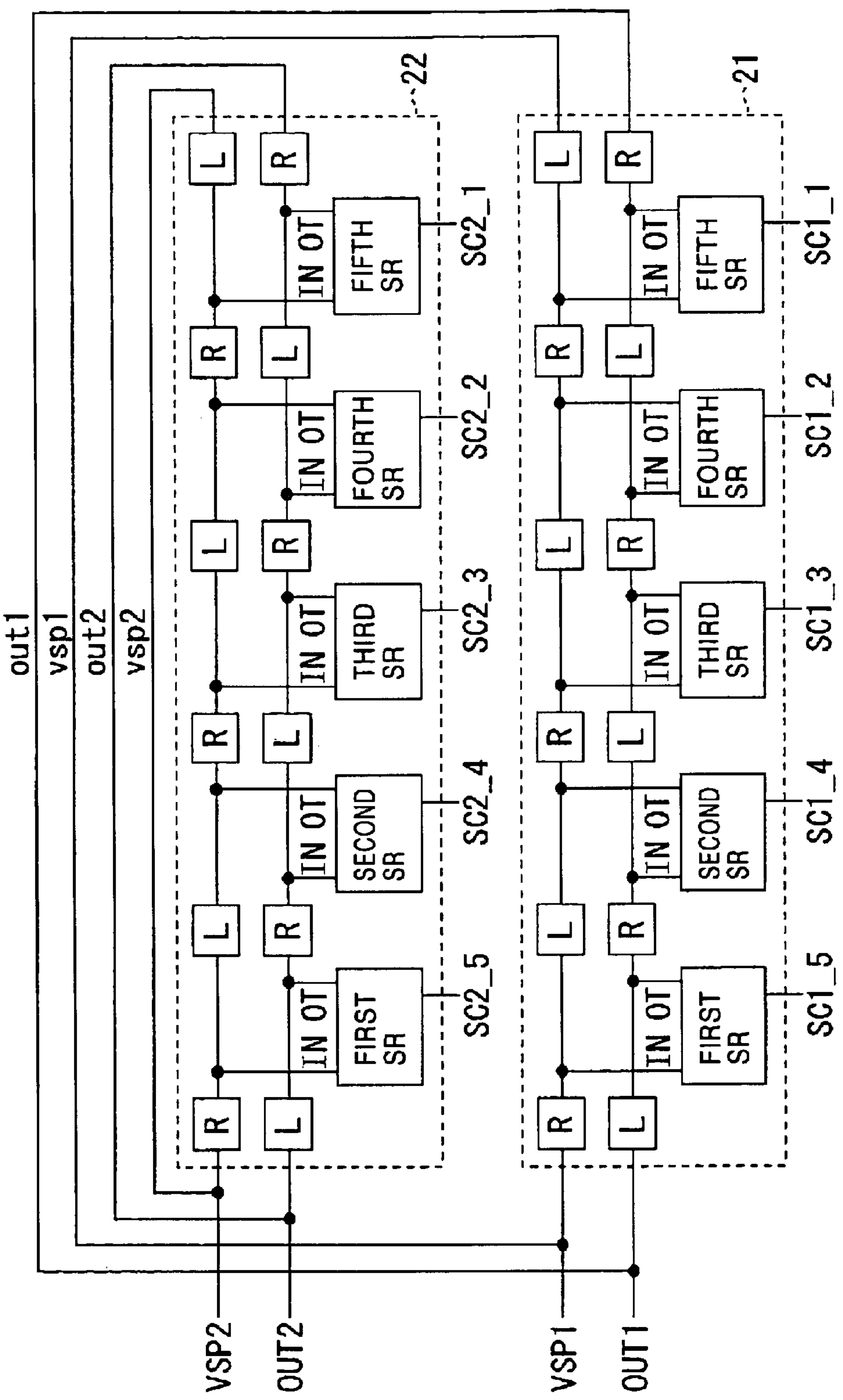
FIG. 6 illustrates an arrangement obtained by applying the known bidirectional signal transmission circuit of FIG. 4 to the active matrix organic EL display.

FIG. 6 is a diagram of the structure of the known display 1 of FIG. 1 in which a first bidirectional signal transmission circuit 21 is used as the vertical write-scan drive circuit 4 and a second bidirectional signal transmission circuit 22 is used as the vertical erase-scan drive circuit 5. Each bidirectional signal transmission circuit includes first to fifth shift registers. Specifically, each shift register (SR) comprises a D-type flip-flop. A start pulse VSP1 is supplied to an input terminal in either end of the bidirectional signal transmission circuit 21 for write shown by a broken line. A detection signal OUT1 is output from an output terminal in the other end. A start pulse VSP2 is supplied to an input terminal in either end of the bidirectional signal transmission circuit 22 for erase shown by another broken line. A detection signal OUT2 is generated from an output terminal in the other end. To minimize the number of intersections of signal lines, a signal line vsp1 to transmit the start pulse VSP1, a signal line out1 to transmit the detection signal OUT1, a signal line vsp2 to transmit the start pulse VSP2, and a signal line out2 to transmit the detection signal OUT2 are arranged as shown in FIG. 6. The signal line vsp1 is disposed between the signal lines out1 and out2. The signal line out2 is arranged between the signal lines vsp1 and vsp2.

Figure 7:
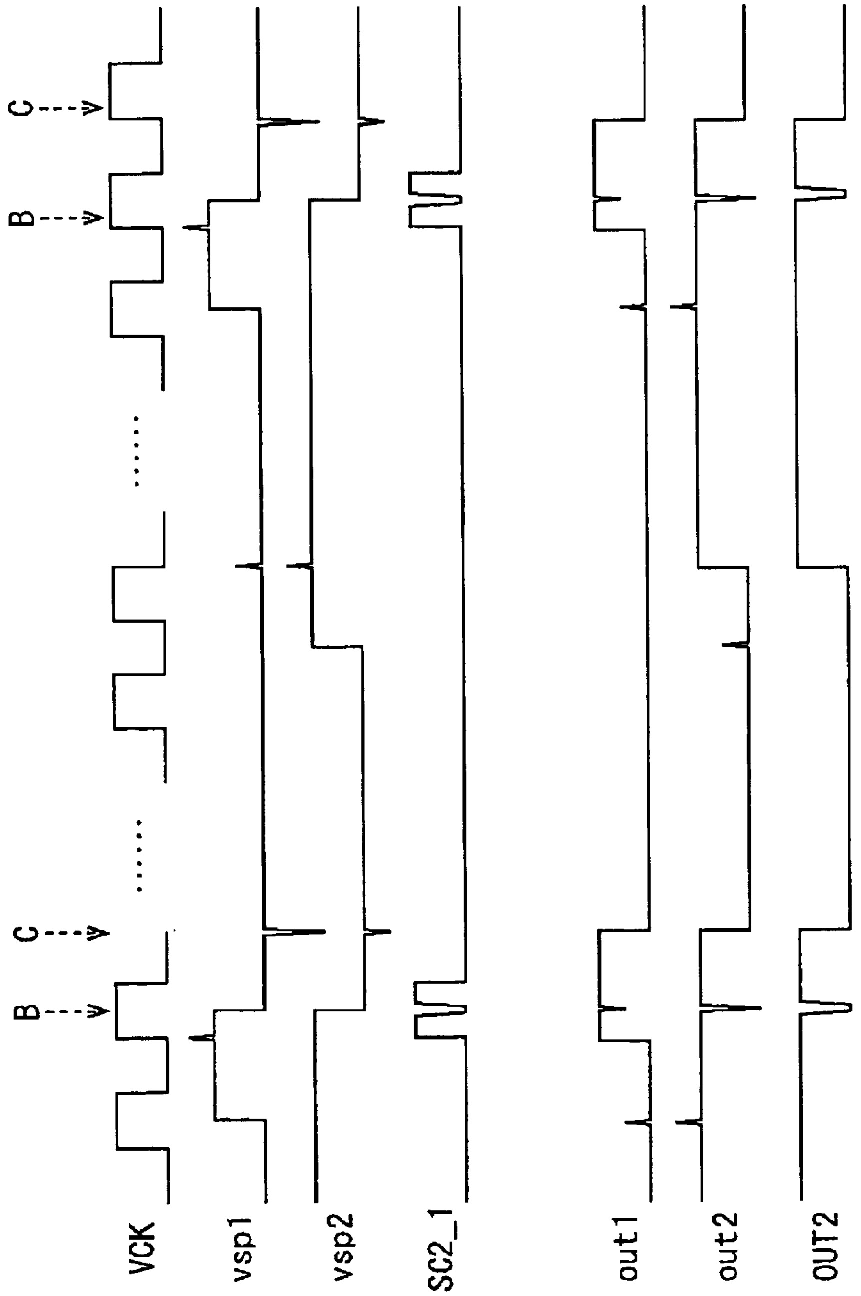
FIG. 7 is a timing chart of an operation in the arrangement shown in FIG. 6.

FIG. 7 is a timing chart of the operations of the two bidirectional signal transmission circuits 21 and 22 shown in FIG. 6. The start pulse VSP1 supplied to the bidirectional signal transmission circuit 21 for write and the start pulse VSP2 supplied to the bidirectional signal transmission circuit 22 for erase are sequentially shifted on the basis of the clock signals VCK and the resultant signals are output as the detection signals OUT1 and OUT2 at the rising edge and falling edge of the clock signal VCK, respectively. The signal lines vsp1, vsp2, out1, and out2 connect the terminals in both the ends of the respective bidirectional signal transmission circuits. Therefore, the signal lines are long and have high resistance. A steep change in voltage on the adjacent line causes noise.

Referring to FIG. 7, each sharp noise occurs upon generating a change in voltage on the adjacent signal line. At timing B in FIG. 7, the voltage levels of the signal lines vsp1 and vsp2 simultaneously fall. Thus, noise occurs in each of the signal lines out1 and out2. Since the signal line out2 is disposed between the signal lines vsp1 and vsp2, the magnitude of the noise in the signal line out2 is twice as large as that in the signal line out1. Consequently, a large sharp noise is generated at timing B. Similarly, the voltage levels of the signal lines out1 and out2 simultaneously rise at timing C. Since the signal line vsp1 is disposed between the signal lines out1 and out2, the magnitude of noise in the signal line vsp1 is twice as much as that in the signal line vsp2. Thus, a large sharp noise occurs at timing C. Each sharp noise exceeds a threshold value of the gate at the next stage in the corresponding signal line and is inverted, so that the noise is increased. The sharp noises may cause malfunctions of the bidirectional signal transmission circuits or adversely affect on the gate lines of the write scan transistors and the erase scan transistors of display pixels, resulting in a lateral linear defect. The known bidirectional signal transmission circuits have the above-mentioned disadvantages.

To overcome the above disadvantages, a bidirectional signal transmission circuit according to the present invention changes the direction using a direction switching signal. The present bidirectional signal transmission circuit has operation confirming terminals for confirming the operation of this circuit at both ends of the bidirectional signal transmission circuit. Further, the present bidirectional signal transmission circuit includes a buffer element for reducing the impedance of a signal line, the buffer element being disposed just after at least one terminal of the bidirectional signal transmission circuit. Preferred embodiments of the bidirectional signal transmission circuit according to the present invention will now be described in detail hereinbelow with reference to the drawings.

Figure 8:
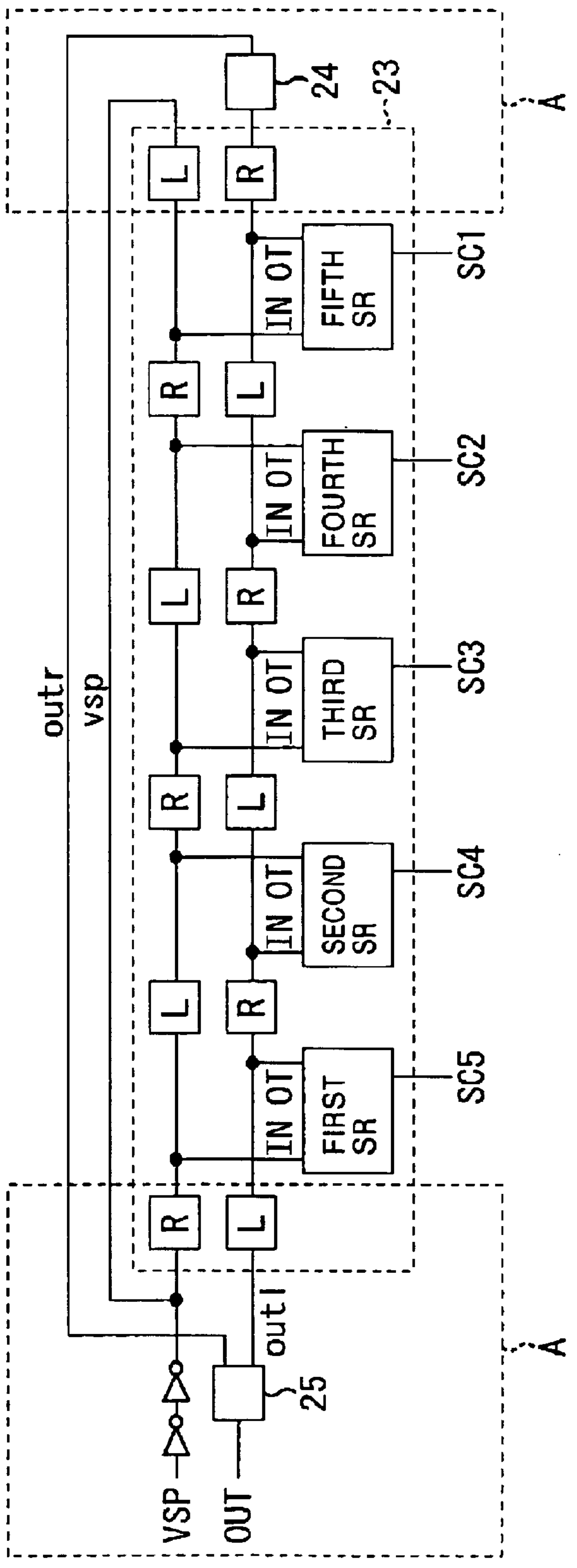
FIG. 8 is a block diagram of a bidirectional signal transmission circuit according to the present invention.

FIG. 8 is a block diagram of the structure of a bidirectional signal transmission circuit 23 according to the present invention. The circuit 23 includes shift registers, for example, first to fifth shift registers SC5 to SC1. Specifically, each shift register (SR) comprises a D-type flip-flop as shown in FIG. 5. A start pulse VSP is supplied to one end of the bidirectional signal transmission circuit 23 shown by a broken line in FIG. 8. The start pulse VSP passes through two inverters, thus forming a signal vsp. The signal vsp is supplied to an input terminal in either end of the bidirectional signal transmission circuit 23. Confirmation signals are output from output terminals in both the ends of the bidirectional signal transmission circuit 23. The resultant confirmation signal is generated as an output signal OUT from one end of the bidirectional signal transmission circuit 23.

Referring to FIG. 8, a buffer element 24 is disposed at the output terminal in the other end which is far from the output OUT of the bidirectional signal transmission circuit 23. For the confirmation signals generated from the output terminals in both the ends of the bidirectional signal transmission circuit 23, a confirmation signal outl is generated from the output terminal in the end close to the output OUT and a confirmation signal outr is generated from the other output terminal in the other end through the buffer element 24. The bidirectional signal transmission circuit 23 further includes a gate element 25. The confirmation signals outl and outr are supplied to the gate element 25. An output of the gate element 25 is generated as the output signal OUT. The buffer element 24 is arranged to generate the confirmation signal outr at low impedance. Thus, the signal outr is hardly susceptible to noise caused by the signal vsp on the adjacent signal line.

Figure 9:
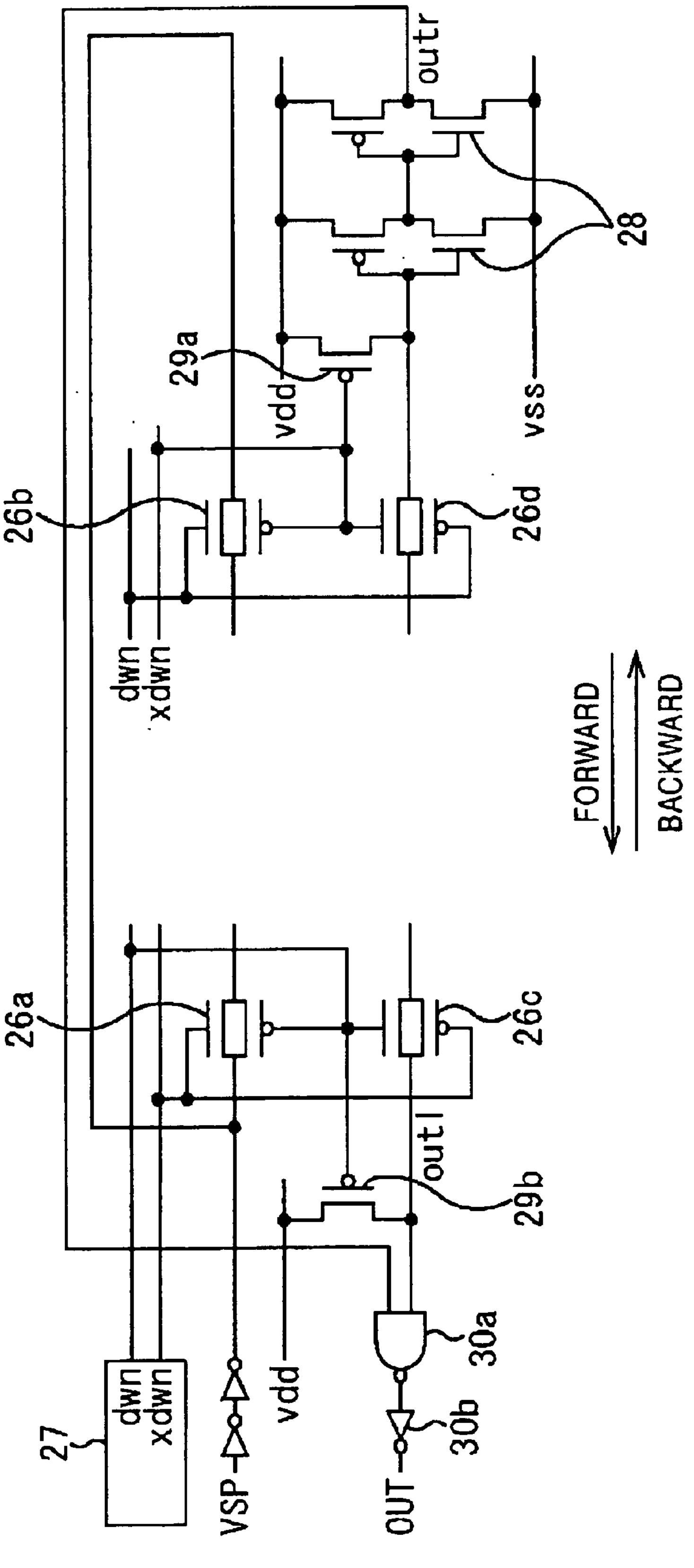
FIG. 9 is a circuit diagram of a bidirectional signal transmission circuit according to a first embodiment of the present invention.

FIG. 9 is a circuit diagram of a bidirectional signal transmission circuit according to a first embodiment of the present invention. FIG. 9 is a detailed circuit diagram of the arrangement in portions A surrounded by broken lines in FIG. 8. Referring to FIG. 9, reversing elements 26 are disposed at input and output terminals of the bidirectional signal transmission circuit. Signals dwn and xdwn generated from a direction control circuit 27 control the turn-on/off of the reversing elements 26. A buffer element 28 is arranged between an output of a reversing element 26*d* and a confirmation signal outr. The buffer element 28 comprises insulated gate field effect transistors. Specifically, as shown in FIG. 9, two inverters each comprising a PMOS transistor and an NMOS transistor are connected in series to constitute the buffer element 28. An output of the buffer element 28, disposed in one end, serves as the confirmation signal outr. An output of a reversing element 26*c*, disposed in the other end, serves as a confirmation signal outl. The signals outr and outl are supplied to a gate element 30. The gate element 30 comprises a 2-input NAND circuit 30*a* and an inverter 30*b* as shown in FIG. 9. An output of the gate element 30 serves as an output signal OUT of the bidirectional signal transmission circuit. Referring to FIG. 9, a pull-up element 29*a* is arranged between the output of the reversing element 26*d* and an input of the buffer element 28. The pull-up element 29*a* comprises a PMOS transistor. The source of the PMOS transistor is connected to a power supply vdd, the drain thereof is connected to the input of the buffer element 28, and the gate thereof is connected to the signal xdwn output from the direction control circuit 27.

Again referring to FIG. 9, a pull-up element 29*b* is disposed between the signal outl output from the reversing element 26*c* and the gate element 30. The pull-up element 29*b* comprises a PMOS transistor. The source of the PMOS transistor is connected to the power supply vdd, the drain thereof is connected to the signal outl, and the gate thereof is connected to the signal dwn output from the direction control circuit 27. It is assumed that two directions indicate the forward direction and the backward direction as shown by arrows in FIG. 9. In the forward direction, the signal dwn goes to the level "H" and the signal xdwn goes to the level "L", so that the reversing elements 26*b* and 26*c* are turned on and the reversing elements 26*a* and 26*d* are turned off. A start pulse VSP of the bidirectional signal transmission circuit is buffered through two inverters, thus forming a signal vsp. Since the reversing element 26*a* is turned off, the signal vsp is supplied to the reversing element 26*b* and is then transmitted to the reversing element 26*c* through shift registers in a multi-stage arrangement. The transmitted signal is then supplied as the operation confirmation signal outl from the reversing element 26*c* to the gate element 30. The pull-up element 29*b* is turned off because the signal dwn connected to the gate of the pull-up element 29*b* is at the level "H". The pull-up element 29*a* is turned on because the reversing element 26*d* is turned off and the signal xdwn connected to the gate of the pull-up element 29*a* is at the level "L". Thus, the input of the buffer element 28 is fixed to the level "H". Accordingly, the output outr of the buffer element 28 goes to the level "H". Consequently, the output OUT generated from the gate element 30 reflects information of the signal outl. On the other hand, in the backward direction, the signal dwn goes to the level "L" and the signal xdwn goes to the level "H", so that the reversing elements 26*a* and 26*d* are turned on and the reversing elements 26*b* and 26*c* are turned off. The start pulse VSP of the bidirectional signal transmission circuit is buffered through the two inverters, thus forming the signal vsp. Since the reversing element 26*b* is turned off, the signal vsp is supplied to the reversing element 26*a* and is then transmitted to the reversing element 26*d* through the shift registers in the multi-stage arrangement. The transmitted signal is then supplied as the operation confirmation signal outr from the reversing element 26*d* to the gate element 30. The pull-up element 29*a* connected to the input signal of the buffer element 28 is turned off because the signal xdwn connected to the gate of the pull-up element 29*a* is at the level "H". The pull-up element 29*b* is turned on because the reversing element 26*c* is turned off and the signal dwn connected to the gate of the pull-up element 29*b* is at the level "L". Thus, the signal outl goes to the level "H". Therefore, the output signal OUT generated from the gate element 30 reflects information of the signal outr. In the backward direction, the buffer element 28 is arranged to generate the signal outr at low impedance. Thus, the signal outr is hardly susceptible to noise caused by the signal vsp on the adjacent signal line.

Figure 10:
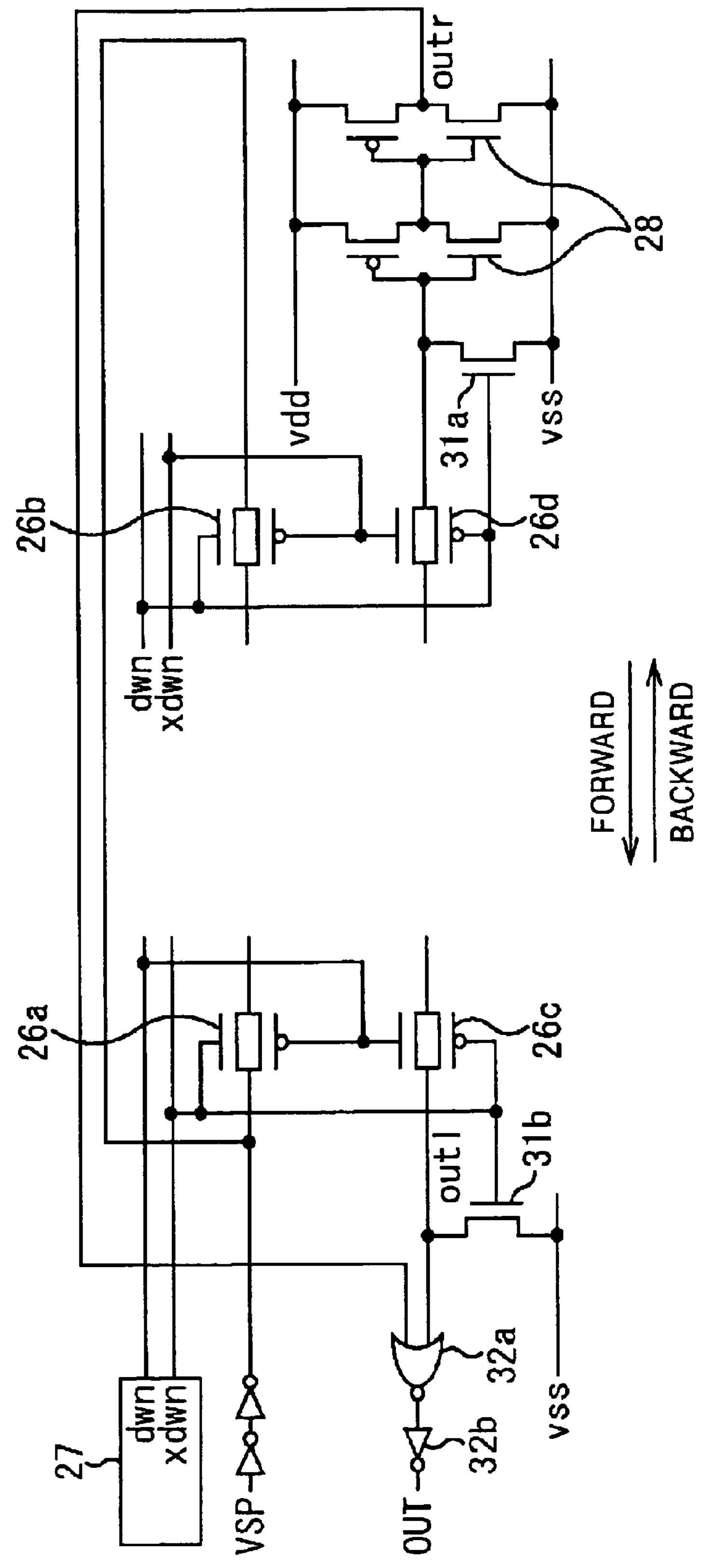
FIG. 10 is a circuit diagram of a bidirectional signal transmission circuit according to a second embodiment of the present invention.

FIG. 10 is a circuit diagram of a bidirectional signal transmission circuit according to a second embodiment of the present invention. FIG. 10 is a detailed circuit diagram of the arrangement in the portions A shown by the broken lines in FIG. 8.

Referring to FIG. 10, reversing elements 26 are disposed at input and output terminals in both ends of the bidirectional signal transmission circuit. Signals dwn and xdwn generated from a direction control circuit 27 control the turn-on/off of the reversing elements 26. A buffer element 28 is arranged between an output of a reversing element 26*d* and a confirmation signal outr. The buffer element 28 comprises insulated gate field effect transistors. Specifically, two inverters each comprising a PMOS transistor and an NMOS transistor are connected in series to constitute the buffer element 28, as shown in FIG. 10. An output of the buffer element 28 serves as the confirmation signal outr. An output of a reversing element 26*c* serves as a confirmation signal outl. The signals outr and outl are supplied to a gate element 32. The gate element 32 comprises a 2-input NOR circuit 32*a* and an inverter 32*b*, as shown in FIG. 10. An output of the gate element 32 serves as an output signal OUT of the bidirectional signal transmission circuit. Referring to FIG. 10, a pull-down element 31*a* is arranged between the output of the reversing element 26*d* and an input of the buffer element 28. The pull-down element 31*a* comprises an NMOS transistor. The source of the NMOS transistor is connected to ground vss, the drain thereof is connected to the input of the buffer element 28, and the gate thereof is connected to the signal dwn output from the direction control circuit 27. On the other hand, a pull-down element 31*b* is disposed between the signal outl output from the reversing element 26*c* and the gate element 32 as shown in FIG. 10. The pull-down element 31*b* comprises an NMOS transistor. The source of the NMOS transistor is connected to the ground vss, the drain thereof is connected to the signal outl, and the gate thereof is connected to the signal xdwn output from the direction control circuit 27. It is assumed that two directions indicate the forward direction and the backward direction as shown by arrows in FIG. 10. In the forward direction, the signal dwn goes to the level "H" and the signal xdwn goes to the level "L", so that the reversing elements 26*b* and 26*c* are turned on and the reversing elements 26*a* and 26*d* are turned off. A start pulse VSP of the bidirectional signal transmission circuit is buffered through two inverters, thus forming a signal vsp. Since the reversing element 26*a* is turned off, the signal vsp is supplied to the reversing element 26*b* and is then transmitted to the reversing element 26*c* via shift registers in a multi-stage arrangement. The signal is then supplied as the operation confirmation signal outl from the reversing element 26*c* to the gate element 32. The pull-down element 31*b* connected to the signal outl is turned off because the signal xdwn connected to the gate of the element 31*b* is at the level "L". On the other hand, the pull-down element 31*a* is turned on because the reversing element 26*d* is turned off and the signal dwn connected to the gate of the pull-down element 31*a* is at the level "H". Thus, the input of the buffer element 28 is fixed to the level "L". Accordingly, the output outr of the buffer element 28 goes to the level "L". Consequently, the output signal OUT generated from the gate element 32 reflects information of the signal outl. On the other hand, in the backward direction, the signal dwn goes to the level "L" and the signal xdwn goes to the level "H", so that the reversing elements 26*a* and 26*d* are turned on and the reversing elements 26*b* and 26*c* are turned off. The start pulse VSP of the bidirectional signal transmission circuit is buffered through the two inverters, thus forming the signal vsp. Since the reversing element 26*b* is turned off, the signal vsp is supplied to the reversing element 26*a* and is then transmitted to the reversing element 26*d* via the shift registers. The signal is then supplied as the operation confirmation signal outr from the reversing element 26*d* to the gate element 32. The pull-down element 31*a* connected to the input signal of the buffer element 28 is turned off because the signal dwn connected to the gate of the pull-down element 31*a* is at the level "L". On the other hand, the pull-down element 31*b* is turned on because the reversing element 26*c* is turned off and the signal xdwn connected to the gate of the pull-down element 31*b* is at the level "H". Thus, the signal outl goes to the level "L". Therefore, the output signal OUT generated from the gate element 32 reflects information of the signal outr. In the backward direction, the buffer element 28 is arranged to generate the signal outr at low impedance. Thus, the signal outr is hardly susceptible to noise caused by the signal vsp on the adjacent signal line.

Figure 11:
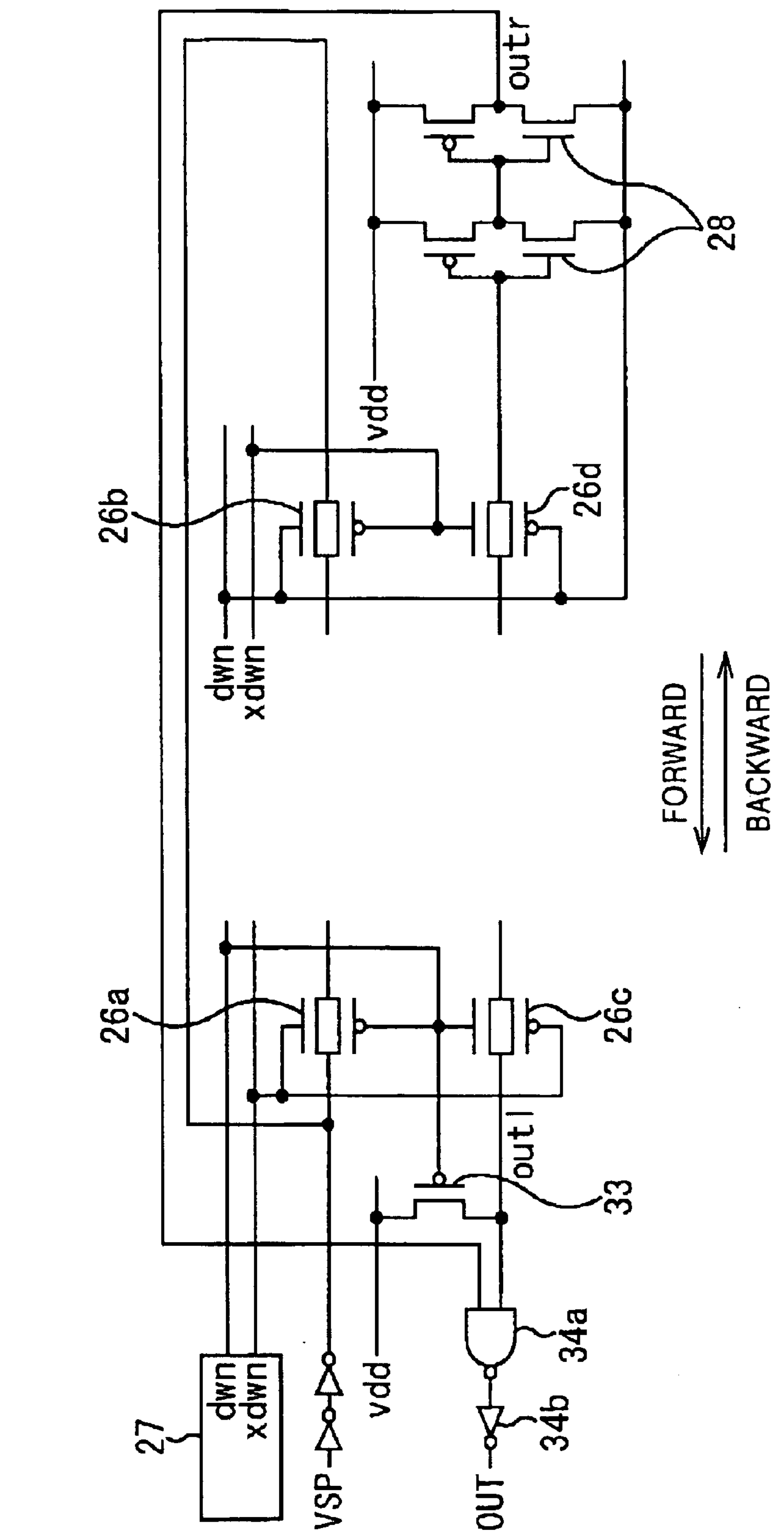
FIG. 11 is a circuit diagram of a bidirectional signal transmission circuit according to a third embodiment of the present invention.

FIG. 11 is a circuit diagram of a bidirectional signal transmission circuit according to a third embodiment of the present invention. FIG. 11 is a detailed circuit diagram of the arrangement in the portions A surrounded by the broken lines in FIG. 8.

Referring to FIG. 11, reversing elements 26 are disposed at input and output terminals in both ends of the bidirectional signal transmission circuit. Signals dwn and xdwn generated from a direction control circuit 27 control the turn-on/off of the reversing elements 26. A buffer element 28 is arranged between an output of a reversing element 26*d* and a confirmation signal outr. The buffer element 28 comprises insulated gate field effect transistors. Specifically, as shown in FIG. 11, two inverters each comprising a PMOS transistor and an NMOS transistor are connected in series to constitute the buffer element 28. An output of the buffer element 28, disposed in one end, serves as the signal outr. An output of a reversing element 26*c*, disposed in the other end, serves as a signal outl. The signals outr and outl are supplied to a gate element 34. The gate element 34 comprises a 2-input NAND circuit 34*a* and an inverter 34*b* as shown in FIG. 11. An output of the gate element 34 serves as an output signal OUT of the bidirectional signal transmission circuit. The signal dwn generated from the direction control circuit 27 is connected to the sources of the NMOS transistors included in the buffer element 28. A pull-up element 33 is arranged between the signal outl generated from the reversing element 26*c* and the gate element 34. The pull-up element 33 comprises a PMOS transistor. The source of the PMOS transistor is connected to a power supply vdd, the drain thereof is connected to the signal outl, and the gate thereof is connected to the signal dwn output from the direction control circuit 27. It is assumed that two directions indicate the forward direction and the backward direction, as shown by arrows in FIG. 11. In the forward direction, the signal dwn goes to the level "H" and the signal xdwn goes to the level "L", so that the reversing elements 26*b* and 26*c* are turned on and the reversing elements 26*a* and 26*d* are turned off. A start pulse VSP of the bidirectional signal transmission circuit is buffered through the two inverters, thus forming a signal vsp. Since the reversing element 26*a* is turned off, the signal vsp is supplied to the reversing element 26*b* and is then transmitted to the reversing element 26*c* through shift registers in a multi-stage arrangement. The transmitted signal is then supplied as the operation confirmation signal outl from the reversing element 26*c* to the gate element 34. The pull-up element 33 connected to the signal outl is turned off because the signal dwn connected to the gate of the pull-up element 33 is at the level "H". The reversing element 26*d* is turned off. The signal dwn, connected to the sources of the NMOS transistors constituting the buffer element 28, is at the level "H". Accordingly, the output outr of the buffer element 28 becomes the level "H". Thus, the output signal OUT generated from the gate element 34 reflects information of the signal outl. On the other hand, in the backward direction, the signal dwn goes to the level "L" and the signal xdwn becomes the level "H", so that the reversing elements 26*a* and 26*d* are turned on and the reversing elements 26*b* and 26*c* are turned off. The start pulse VSP of the bidirectional signal transmission circuit is buffered through the two inverters, thus forming the signal vsp. Since the reversing element 26*b* is turned off, the signal vsp is supplied to the reversing element 26*a* and is then transmitted to the reversing element 26*d* through the shift registers. The transmitted signal is then supplied as the operation confirmation signal outr from the reversing element 26*d* to the gate element 34. The reversing element 26*c* is turned off and the signal dwn connected to the gate of the pull-up element 33 is at the level "L". Accordingly, the pull-up element 33 is turned on and the signal outl becomes the level "H". Therefore, the output signal OUT generated from the gate element 34 reflects information of the signal outr. In the backward direction, the buffer element 28 is arranged to generate the signal outr at low impedance. Thus, the signal outr is hardly susceptible to noise caused by the signal vsp on the adjacent signal line.

Figure 12:
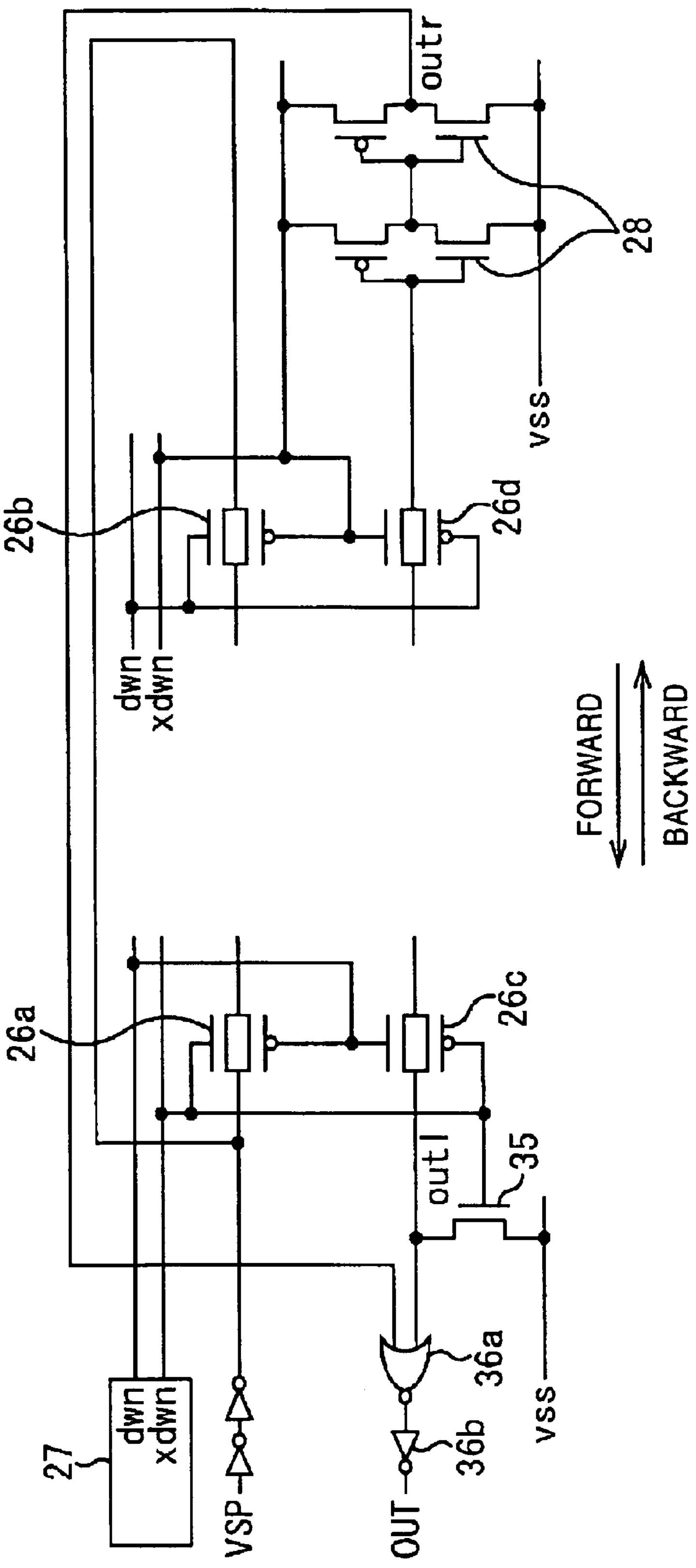
FIG. 12 is a circuit diagram of a bidirectional signal transmission circuit according to a fourth embodiment of the present invention.

FIG. 12 is a circuit diagram of a bidirectional signal transmission circuit according to a fourth embodiment of the present invention. FIG. 12 is a detailed circuit diagram of the arrangement in the portions A shown by the broken lines in FIG. 8.

Referring to FIG. 12, reversing elements 26 are disposed at input and output terminals on both ends of the bidirectional signal transmission circuit. Signals dwn and xdwn, generated from a direction control circuit 27, control the turn-on/off of the reversing elements 26. A buffer element 28 is arranged between an output of a reversing element 26*d* and a confirmation signal outr. The buffer element 28 comprises insulated gate field effect transistors. Specifically, two inverters each comprising a PMOS transistor and an NMOS transistor are connected in series to constitute the buffer element 28 as shown in FIG. 12. An output of the buffer element 28, disposed in one end, serves as the signal outr. An output of a reversing element 26*c*, arranged in the other end, serves as a confirmation signal outl. The signals outr and outl are supplied to a gate element 36. The gate element 36 comprises a 2-input NOR circuit 36*a* and an inverter 36*b* as shown in FIG. 12. An output of the gate element 36 serves as an output signal OUT of the bidirectional signal transmission circuit. The signal xdwn generated from the direction control circuit 27 is connected to the respective sources of the PMOS transistors included in the buffer element 28. A pull-down element 35 is arranged between the signal outl generated from the reversing element 26*c* and the gate element 36. The pull-down element 35 comprises an NMOS transistor. The source of the NMOS transistor is connected to ground vss, the drain thereof is connected to the signal outl, and the gate thereof is connected to the signal xdwn output from the direction control circuit 27. It is assumed that two directions indicate the forward direction and the backward direction, as shown by arrows in FIG. 12. In the forward direction, the signal dwn becomes the level "H" and the signal xdwn goes to the level "L", so that the reversing elements 26*b* and 26*c* are turned on and the reversing elements 26*a* and 26*d* are turned off. A start pulse VSP of the bidirectional signal transmission circuit is buffered through the two inverters, thus forming a signal vsp. Since the reversing element 26*a* is turned off, the signal vsp is supplied to the reversing element 26*b* and is then transmitted to the reversing element 26*c* via shift registers in a multi-stage arrangement. The transmitted signal is then supplied as the operation confirmation signal outl from the reversing element 26*c* to the gate element 36. The pull-down element 35 connected to the signal outl is turned off because the signal xdwn connected to the gate of the pull-down element 35 is at the level "L". The reversing element 26*d* is turned off. The signal xdwn, connected to the sources of the PMOS transistors included in the buffer element 28, is at the level "L". Accordingly, the output outr of the buffer element 28 goes to the level "L". Consequently, the output signal OUT generated from the gate element 36 reflects information of the signal outl. On the other hand, in the backward direction, the signal dwn goes to the level "L" and the signal xdwn goes to the level "H", so that the reversing elements 26*a* and 26*d* are turned on and the reversing elements 26*b* and 26*c* are turned off. The start pulse VSP of the bidirectional signal transmission circuit is buffered through the two inverters, thus forming the signal vsp. Since the reversing element 26*b* is turned off, the signal vsp is supplied to the reversing element 26*a* and is then transmitted to the reversing element 26*d* via the shift registers. The transmitted signal is then supplied as the operation confirmation signal outr from the reversing element 26*d* to the gate element 36. Since the reversing element 26*c* is turned off and the signal xdwn connected to the gate of the pull-down element 35 is at the level "H", the pull-down element 35 is turned on and the signal outl becomes the level "L". Therefore, the output signal OUT generated from the gate element 36 reflects information of the signal outr. In the backward direction, the buffer element 28 is arranged to generate the signal outr at low impedance. Thus, the signal outr is hardly susceptible to noise caused by the signal vsp on the adjacent signal line.

As mentioned above, according to the present invention, the bidirectional signal transmission circuit includes: a gate element which is connected to output terminals disposed on both ends of the bidirectional signal transmission circuit, the gate element for passing a signal generated from the output terminal on one end selected in accordance with the transmitting direction; and potential fixing means for fixing the potential of the output terminal in the other end so that the potential is not floating, the other end being not selected in accordance with the transmitting direction. For example, the potential fixing means comprises either a pull-up element for pulling up the potential of an output of a buffer element, disposed close to the output terminal which is not selected, to the potential of a power supply in accordance with a switching signal, or a pull-down element for pulling down the output potential of the buffer element to a ground potential in accordance with the switching signal. According to the present invention, the bidirectional signal transmission circuit has the buffer in a relatively high impedance signal line through which an operation confirmation signal is transmitted, thus reducing the influence of noise generated on the adjacent signal line. Further, an input of the buffer is pulled up to the potential of a power supply or is pulled down to a ground potential, thus logically eliminating a floating state of the signal line. Consequently, a malfunction of the bidirectional signal transmission circuit can be prevented.

Figure 13:
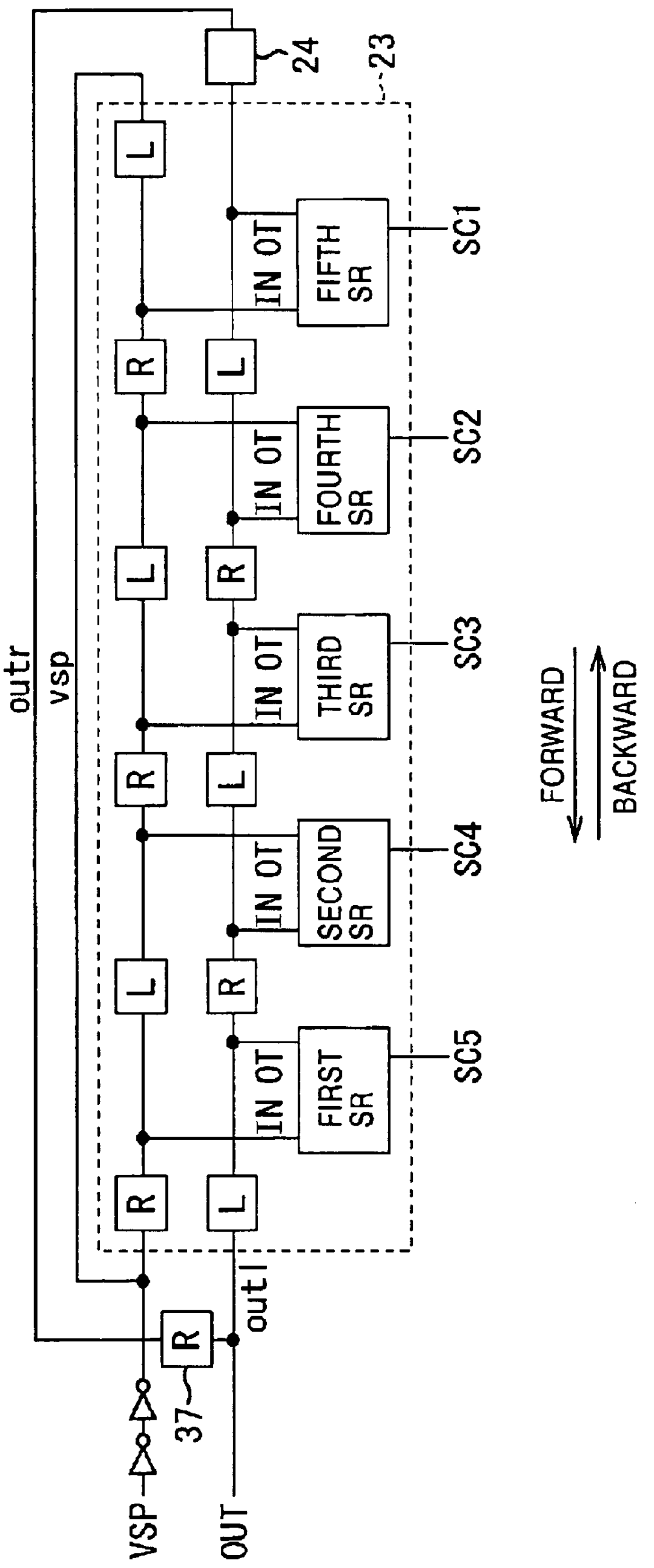
FIG. 13 is a block diagram of a bidirectional signal transmission circuit according to a fifth embodiment of the present invention.

FIG. 13 is a block diagram of a bidirectional signal transmission circuit according to a fifth embodiment of the present invention.

Referring to FIG. 13, a bidirectional signal transmission circuit 23, shown by a broken line, has first to fifth shift registers SC5 to SC1. Specifically, each shift register (SR) comprises a D-type flip-flop as shown in FIG. 5. A start pulse VSP is supplied to one end of the bidirectional signal transmission circuit 23. The start pulse VSP passes through two inverters, thus forming a signal vsp. The signal vsp is supplied to an input terminal in either end of the bidirectional signal transmission circuit 23. Confirmation signals are output from output terminals in both the ends of the bidirectional signal transmission circuit 23. The resultant confirmation signal is generated as an output signal OUT from one end of the bidirectional signal transmission circuit 23.

Referring to FIG. 13, a buffer element 24 is disposed at the output terminal in the other end which is far from the output OUT of the bidirectional signal transmission circuit 23. The buffer element 24 comprises two inverters connected in series, each inverter comprising a PMOS transistor and an NMOS transistor. For the confirmation signals generated from the output terminals in both the ends of bidirectional signal transmission circuit 23, a confirmation signal outl is generated from the output terminal in the end close to the output OUT and a confirmation signal outr is generated from the other output terminal in the other end through the buffer element 24. A backward-path gate element 37 is disposed in a signal line to transmit the signal outr so as to be close to the output OUT. The confirmation signal outr passes through the backward-path gate element 37 and is then connected to the signal outl. The resultant signal is generated as the signal OUT. It is assumed that two directions indicate the forward direction and the backward direction, as shown by arrows in FIG. 13. In the backward direction, the buffer element 24 is arranged to generate the signal outr at low impedance. Thus, the signal outr is hardly influenced by noise caused by the signal vsp on the adjacent signal line. In the forward direction, the backward-path gate element 37 produces the high-impedance signal outr. Accordingly, the signal outl is extracted as the output OUT.

As mentioned above, according to the present embodiment, the bidirectional signal transmission circuit includes high-impedance state producing means for setting an output of a buffer element at high impedance in response to a switching signal when signal lines extending from the respective output terminals in both the ends of the bidirectional signal transmission circuit are connected into one signal line and an output terminal close to the buffer element is not selected in accordance with the switching signal.

Figure 14:
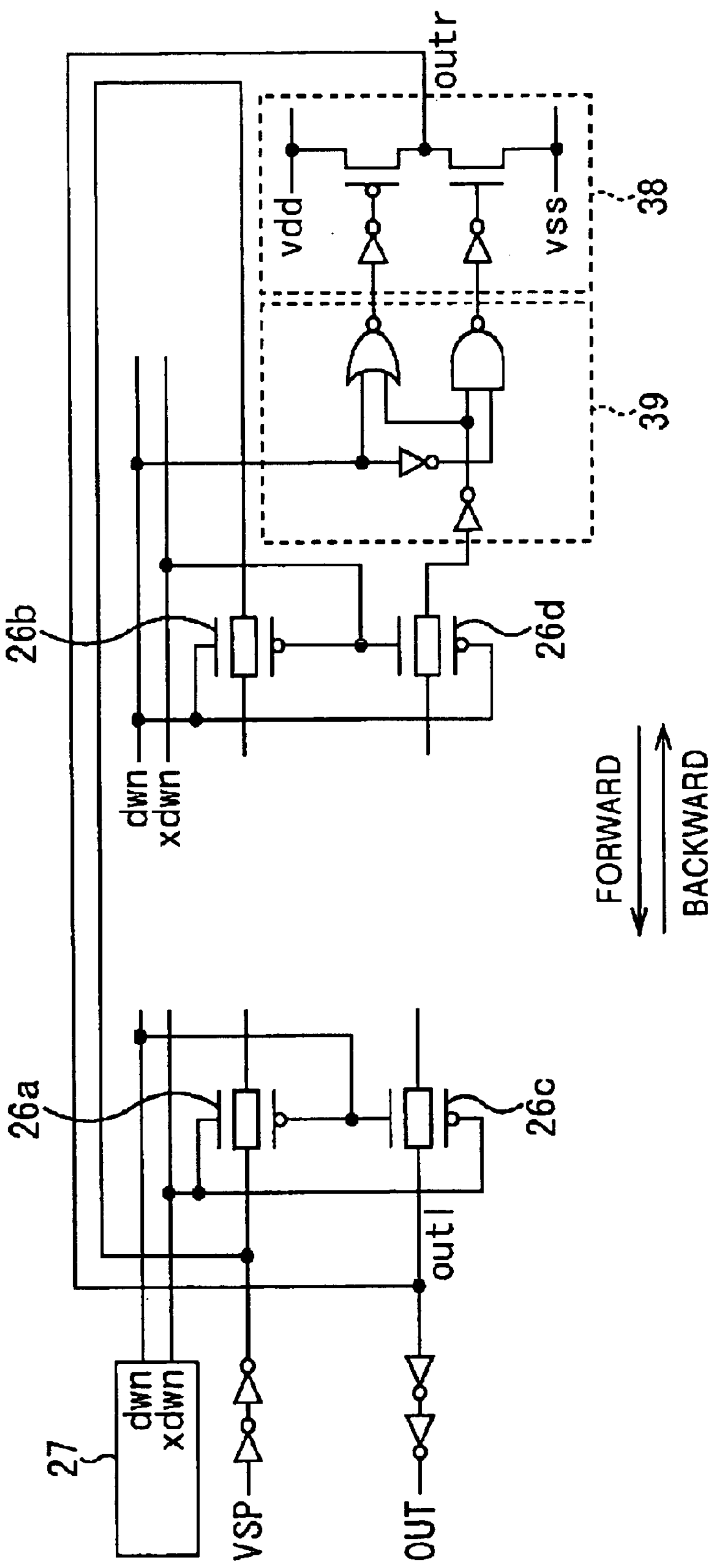
FIG. 14 is a circuit diagram of a bidirectional signal transmission circuit according to a sixth embodiment of the present invention.

FIG. 14 is a circuit diagram of a bidirectional signal transmission circuit according to a sixth embodiment of the present invention.

Referring to FIG. 14, reversing elements 26 are disposed at input and output terminals in both ends of the bidirectional signal transmission circuit. Signals dwn and xdwn generated from a direction control circuit 27 control the turn-on/off of the reversing elements 26. A buffer circuit 38 is arranged between an output of a reversing element 26*d* and a signal outr. The buffer circuit 38 comprises insulated gate field effect transistors. Specifically, as shown in FIG. 14, the buffer circuit 38 comprises: a first inverter comprising a PMOS transistor and a NMOS transistor; and second inverters for driving the respective transistors, the second inverters being connected to the gates of the respective transistors. An output of the buffer circuit 38 serves as the signal outr, the buffer circuit 38 being disposed in one end of the bidirectional signal transmission circuit. An output of a reversing element 26*c*, disposed in the other end, serves as a signal outl.

Referring to FIG. 14, the signals outr and outl are directly connected to each other. The resultant signal is generated as an output signal OUT through two inverters. A high-impedance state producing circuit 39 is disposed between the buffer circuit 38 and the reversing element 26*d*. As shown in FIG. 14, the circuit 39 comprises a NAND circuit, a NOR circuit, and two inverters. The signal dwn is connected to one input terminal of each of the NAND circuit and the NOR circuit. The output signal of the reversing element 26*d* is connected to the other input terminal of each of the NAND circuit and the NOR circuit. It is assumed that two directions indicate the forward direction and the backward direction as shown by arrows in FIG. 14. In the forward direction, the signal dwn goes to the level "H" and the signal xdwn goes to the level "L", so that the reversing elements 26*b* and 26*c* are turned on and the reversing elements 26*a* and 26*d* are turned off. A start pulse VSP of the bidirectional signal transmission circuit is buffered through two inverters. Since the reversing element 26*a* is turned off, the buffered signal is supplied to the reversing element 26*b* and is then transmitted to the reversing element 26*c* via shift registers in a multi-stage arrangement. The signal is then supplied as the operation confirmation signal outl from the reversing element 26*c* to two inverters. In the buffer circuit 38 connected to the signal outl, on the basis of the signal dwn supplied to the NAND circuit and the NOR circuit of the high-impedance state producing circuit 39, the two transistors constituting the first inverter of the buffer circuit 38 are turned off. Accordingly, the buffer circuit 38 generates a high-impedance output. That is, the signal outr has high impedance. Consequently, the signal outl is buffered through the two inverters and the output signal OUT reflects the signal outl. On the other hand, in the backward direction, the signal dwn goes to the level "L" and the signal xdwn goes to the level "H", so that the reversing elements 26*a* and 26*d* are turned on and the reversing elements 26*b* and 26*c* are turned off. The start pulse VSP of the bidirectional signal transmission circuit is buffered through the two inverters. Since the reversing element 26*b* is turned off, the buffered signal VSP is supplied to the reversing element 26*a* and is then transmitted to the reversing element 26*d* via the shift registers. Since the signal dwn supplied to the NAND circuit and the NOR circuit of the high-impedance state producing circuit 39 is at the level "L", the NAND circuit and the NOR circuit of the circuit 39 reflect the output of the reversing element 26*d* as it is. An output of the circuit 39 is supplied to the buffer circuit 38, thus generating a low-impedance signal. The low-impedance signal generated from the buffer circuit 38 is connected to the signal outl. Since the reversing element 26*c* is turned off, the signal outl has high impedance. Consequently, the low-impedance signal outr is buffered and the output signal OUT reflects the signal outr. In the backward direction, the buffer circuit 38 is arranged to generate the signal outr at low impedance. Thus, the signal outr is hardly susceptible to noise caused by the signal vsp on the adjacent signal line.

What is claimed is:

1. A bidirectional signal transmission circuit comprising:

a buffer element for reducing the impedance of a signal line;

a signal line disposed between input terminals in both ends of the bidirectional signal transmission circuit; and a signal line disposed between output terminals in these ends, the signal lines being parallel to each other, a signal supplied from the exterior of the bidirectional signal transmission circuit being sequentially transmitted from one end to the other end of the bidirectional signal transmission circuit and then being output from the other end in order to confirm the sequential transmission at the exterior, the transmitting direction being changeable between these ends in response to a switching signal supplied from the exterior, wherein the buffer element for reducing the impedance of the signal line is disposed in at least one end of the signal line arranged between the output terminals.

2. The circuit according to claim 1, further comprising:

a gate element connected to the output terminals in both ends of the bidirectional signal transmission circuit, the gate element passing a signal generated from the output terminal on one end selected in accordance with the transmitting direction; and potential fixing means for fixing the potential of the output terminal in the other end that is not selected in accordance with the transmitting direction so that the potential thereof is not floating.

3. The circuit according to claim 2, wherein the potential fixing means includes either a pull-up element for pulling up the potential of an output of the buffer element, disposed close to the output terminal which is not selected, to the potential of a power supply in response to the switching signal, or a pull-down element for pulling down the output potential of the buffer element to a ground potential in response to the switching signal.

4. The circuit according to claim 1, further comprising: high-impedance state producing means for setting an output of the buffer element to high impedance in response to the switching signal when signal line segments extending from the respective output terminals in both ends of bidirectional signal transmission circuit are connected into one signal line and the output terminal close to the buffer element is not selected in accordance with the switching signal.

* * * * *